United States Patent
Yang

(10) Patent No.: US 7,449,284 B2
(45) Date of Patent: Nov. 11, 2008

(54) METHOD AND STRUCTURE FOR FABRICATING MECHANICAL MIRROR STRUCTURES USING BACKSIDE ALIGNMENT TECHNIQUES

(75) Inventor: Xiao Charles Yang, Sunnyvale, CA (US)

(73) Assignee: Miradia Inc., Sunnyvale, CA (US)

( * ) Notice: Subject to any disclaimer, the term of this patent is extended or adjusted under 35 U.S.C. 154(b) by 590 days.

(21) Appl. No.: 10/843,909

(22) Filed: May 11, 2004

(65) Prior Publication Data

US 2005/0255412 A1 Nov. 17, 2005

(51) Int. Cl.
*G03F 7/00* (2006.01)
(52) U.S. Cl. ............... 430/322; 430/22; 430/30; 430/395; 430/311; 430/396
(58) Field of Classification Search ............ 430/22, 430/322, 5, 396, 30, 395, 311; 257/797
See application file for complete search history.

(56) References Cited

U.S. PATENT DOCUMENTS

| | | | |
|---|---|---|---|
| 4,229,732 A | 10/1980 | Hartstein et al. |
| 4,317,611 A | 3/1982 | Petersen |
| 4,566,935 A | 1/1986 | Hornbeck |
| 4,615,595 A | 10/1986 | Hornbeck |
| 5,061,049 A | 10/1991 | Hornbeck |
| 5,172,262 A | 12/1992 | Hornbeck |
| 5,311,360 A | 5/1994 | Bloom et al. |
| 5,382,961 A | 1/1995 | Gale, Jr. |
| 5,448,314 A | 9/1995 | Heimbuch et al. |
| 5,452,024 A | 9/1995 | Sampsell |

(Continued)

FOREIGN PATENT DOCUMENTS

EP  1237032 A2  9/2002

OTHER PUBLICATIONS

Henley et al., "A New SOI Manufacturing Technology Using Atomic layer Cleaving." Silicon Genesis Corporation Campbell CA. pp. 1-5.

(Continued)

*Primary Examiner*—Mark F. Huff
*Assistant Examiner*—Caleen O Sullivan
(74) *Attorney, Agent, or Firm*—Townsend and Townsend and Crew LLP

(57) ABSTRACT

A method for fabricating mechanical structures from bonding substrates. The method includes providing a bonded substrate structure, which includes a first substrate having a first thickness of silicon material and a first face. The bonded substrate also includes a second substrate having a second thickness and a second face. At least the first substrate or at least the second substrate (or both) has an alignment mark comprising a front-size zero mark within a portion of either the first thickness or the second thickness. The method includes applying a layer of photomasking material overlying a first backside surface of the first substrate. The method includes illuminating electromagnetic radiation using a coherent light source through the layer of photoresist material and through a portion of the first thickness. The method includes detecting an indication of the alignment mark using a signal associated with a portion of the electromagnetic radiation from a second backside of the second substrate. The method also includes exposing a portion of the layer of photomasking material once a pattern a portion of a reticle structure has been aligned using the alignment mark.

25 Claims, 6 Drawing Sheets

U.S. PATENT DOCUMENTS

| | | | |
|---|---|---|---|
| 5,489,952 | A | 2/1996 | Gove et al. |
| 5,504,614 | A | 4/1996 | Webb et al. |
| 5,535,047 | A | 7/1996 | Hornbeck |
| 5,583,688 | A | 12/1996 | Hornbeck |
| 5,589,852 | A | 12/1996 | Thompson et al. |
| 5,600,363 | A | 2/1997 | Hornbeck |
| 5,600,383 | A | 2/1997 | Hornbeck |
| 5,661,591 | A | 8/1997 | Lin et al. |
| 5,663,749 | A | 9/1997 | Farris et al. |
| 5,729,315 | A * | 3/1998 | Takahashi et al. ............ 349/149 |
| 5,742,419 | A | 4/1998 | Dickensheets et al. |
| 5,757,536 | A | 5/1998 | Ricco et al. |
| 5,835,256 | A | 11/1998 | Huibers |
| 5,885,468 | A | 3/1999 | Kozlowski |
| 5,939,171 | A | 8/1999 | Biebl |
| 5,999,306 | A | 12/1999 | Atobe et al. |
| 6,038,056 | A | 3/2000 | Florence et al. |
| 6,046,840 | A | 4/2000 | Huibers |
| 6,049,317 | A | 4/2000 | Thompson et al. |
| 6,080,659 | A * | 6/2000 | Chen et al. .................. 438/633 |
| 6,127,756 | A | 10/2000 | Iwaki et al. |
| 6,172,797 | B1 | 1/2001 | Huibers |
| 6,201,521 | B1 | 3/2001 | Doherty |
| 6,252,277 | B1 | 6/2001 | Chan et al. |
| 6,323,982 | B1 | 11/2001 | Hornbeck |
| 6,337,760 | B1 | 1/2002 | Huibers et al. |
| 6,356,378 | B1 | 3/2002 | Huibers |
| 6,386,661 | B1 | 5/2002 | Richards |
| 6,396,619 | B1 | 5/2002 | Huibers et al. |
| 6,429,033 | B1 * | 8/2002 | Gee et al. ..................... 438/48 |
| 6,529,310 | B1 | 3/2003 | Huibers et al. |
| 6,538,800 | B2 | 3/2003 | Huibers |
| 6,542,653 | B2 | 4/2003 | Wu et al. |
| 6,543,286 | B2 | 4/2003 | Garverick et al. |
| 6,653,052 | B2 * | 11/2003 | Tanaka et al. ............... 430/311 |
| 6,809,852 | B2 | 10/2004 | Tao et al. |
| 6,856,068 | B2 | 2/2005 | Miller et al. |
| 6,879,868 | B2 * | 4/2005 | Mos et al. .................... 700/114 |
| 2002/0041455 | A1 | 4/2002 | Sawada et al. |
| 2002/0071166 | A1 | 6/2002 | Jin et al. |
| 2002/0071169 | A1 | 6/2002 | Bowers et al. |
| 2002/0132389 | A1 | 9/2002 | Patel et al. |
| 2003/0117686 | A1 | 6/2003 | DiCarlo |
| 2003/0207487 | A1 | 11/2003 | Kubena et al. |
| 2003/0224262 | A1 * | 12/2003 | Lof et al. ...................... 430/22 |
| 2004/0000696 | A1 | 1/2004 | Ma et al. |
| 2004/0004753 | A1 | 1/2004 | Pan |
| 2004/0008402 | A1 | 1/2004 | Patel et al. |
| 2004/0125347 | A1 | 7/2004 | Patel et al. |
| 2004/0136044 | A1 | 7/2004 | Miller et al. |
| 2004/0184133 | A1 | 9/2004 | Su et al. |
| 2004/0190817 | A1 | 9/2004 | Aubuchon |
| 2005/0041277 | A1 | 2/2005 | Huibers |

OTHER PUBLICATIONS

Petersen, K.E., Micromechanical Light Modulator Array Fabricated On Silicon. Applied Physics Letters. Oct. 15, 1977, pp. 521-523, vol. 31 No. 8.

Petersen, K.E., Micromechanical Membrane Switches On Silicon. IBM J. Res. Develop., Jul. 1979, pp. 376-385. vol. 23, No. 4.

* cited by examiner

METHOD AND STRUCTURE FOR FABRICATING MECHANICAL MIRROR STRUCTURES USING BACKSIDE ALIGNMENT TECHNIQUES

BACKSIDE ALIGNMENT TECHNIQUES

The present invention relates generally to bonding techniques. More particularly, the invention includes a method and structure for bonding substrates together using alignment marks. Merely by way of example, the invention has been applied to integrating a mechanical based structure with an integrated circuit chip. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. Additionally, DLP relies upon non-standard MEMS based manufacturing techniques, which are often not reliable and lead to increased costs.

From the above, it is seen that an improved technique for processing devices is desired.

BRIEF SUMMARY OF THE INVENTION

According to the present invention, techniques for bonding substrates are provided. More particularly, the invention includes a method and structure for bonding substrates together using alignment marks. Merely by way of example, the invention has been applied to integrating a mechanical based structure with an integrated circuit chip. But it would be recognized that the invention has a much broader range of applicability.

In a specific embodiment, the invention provides a method for fabricating mechanical structures from bonding substrates. The method includes providing a bonded substrate structure, the bonded substrate structure comprising a first substrate having a first thickness and a first face. The bonded substrate has a second thickness and a second face. At least the first substrate or at least the second substrate has an alignment mark within a portion of either the first thickness or the second thickness. The method includes applying a layer of photomasking material overlying a backside surface of the first substrate and illuminating electromagnetic radiation through the layer of photoresist material and through a portion of the first thickness. The method detects an indication of the alignment mark (e.g., standard ASML alignment mark) using a signal associated with a portion of the electromagnetic radiation and exposes a portion of the layer of photomasking material once a pattern has been aligned using the alignment mark. Preferably, alignment occurs to a tolerance of 200 nanometers and less, depending upon the embodiment.

In an alternative specific embodiment, the invention provides a method for fabricating mechanical structures from bonding substrates. The method includes providing a bonded substrate structure, which includes a first substrate having a first thickness of silicon material and a first face. The bonded substrate also includes a second substrate having a second thickness and a second face. At least the first substrate or at least the second substrate (or both) has an alignment mark comprising a front-size zero mark within a portion of either the first thickness or the second thickness. The method includes applying a layer of photomasking material overlying a first backside surface of the first substrate. The method includes illuminating electromagnetic radiation using a coherent light source through the layer of photoresist material and through a portion of the first thickness. The method includes detecting an indication of the alignment mark using a signal associated with a portion of the electromagnetic radiation from a second backside of the second substrate. The method also includes exposing a portion of the layer of photomasking material once a pattern a portion of a reticle structure has been aligned using the alignment mark.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. Preferably, the present method can be used to see alignment marks through a thickness of silicon bearing material such as a silicon wafer. More preferably, the invention includes a method for aligning a photomask onto a backside of a multilayered substrate structure using an alignment mark within a thickness of the multilayered alignment mark, which is accurate and easy to process. The method provides an accurate alignment technique of 200 nanometers and less using standard lithography tools. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
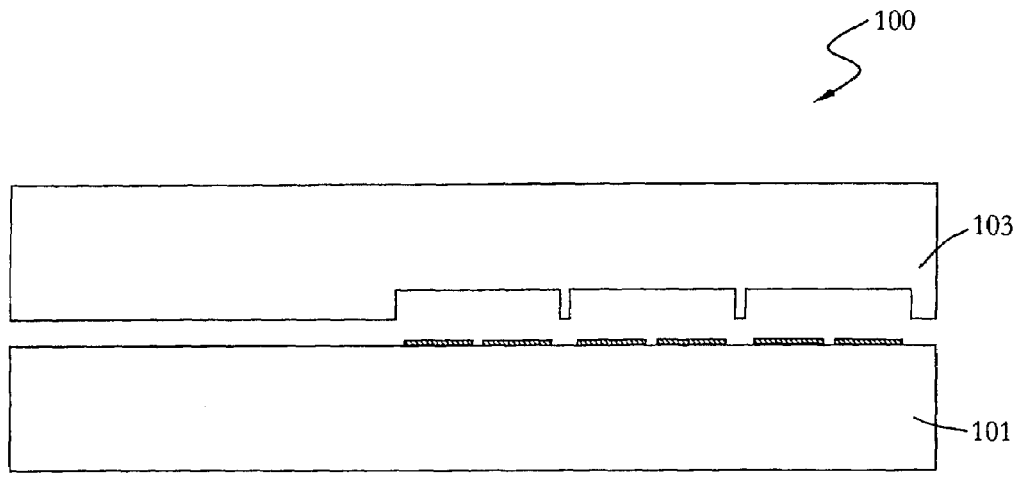
FIGS. 1 through 4 illustrate a method for fabricating a multilayered substrate structure according to an embodiment of the present invention.

According to the present invention, techniques for bonding substrates are provided. More particularly, the invention includes a method and structure for bonding substrates together using alignment marks. Merely by way of example, the invention has been applied to integrating a mechanical based structure with an integrated circuit chip. But it would be recognized that the invention has a much broader range of applicability.

In a specific embodiment, a method for fabricating mechanical structures from bonding substrates can be summarized as follows.

1. Provide a first substrate having a first thickness of silicon material and a first face.
2. Provide a second substrate having a second thickness and a second face.
3. Bond the first face of the first substrate with the second face of the second substrate.
4. Expose an alignment mark comprising a front-size zero mark within a portion of either the first thickness or the second thickness.
5. Apply a layer of photomasking material overlying a first backside surface of the first substrate.
6. Illuminate electromagnetic radiation using a coherent light source through the layer of photoresist material through a portion of the first thickness.
7. Detect an indication of the alignment mark using a signal associated with a portion of the electromagnetic radiation from a second backside of the second substrate.
8. Expose a portion of the layer of photomasking material once a pattern a portion of a reticle structure has been aligned using the alignment mark, and
9. Perform other steps, as desired.

The above sequence of steps provides a method for patterning a backside of a substrate bonding a pair of bonded substrates together according to an embodiment of the present invention. As shown, the method uses a combination of steps including a way of patterning a substrate to release one or more mirror devices for a display device having the plurality of movable mirror structures. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 4 illustrate a method for fabricating a multilayered substrate structure. As shown, the method 100 providing a first substrate 103 having a first thickness and a first face. Preferably, the first substrate includes a plurality of deflection devices. The deflection devices can be mirror structures, such as movable mirrors. Such mirror structures can be used for display devices, such as DLP or the like. Each of the deflection structures can be formed on the first substrate, which is preferably a silicon on insulator substrate structure. The method also includes providing a second substrate structure 101 having a second thickness and a second face. The second substrate structure can be an integrated circuit device having a plurality of electrode devices, as shown. The integrated circuit device can include drive devices coupled to each of the electrodes. The drive devices can be used to apply voltages to the electrodes to actuate selected mirror devices on the first substrate structure. Preferably, the second substrate structure is made using a silicon wafer or other like substrate material. Further details of such substrate structure can be found at U.S. patent application Ser. No. 10/718,482, filed Nov. 19, 2003, commonly owned, and hereby incorporated by reference for all purposes.

Figure 2:
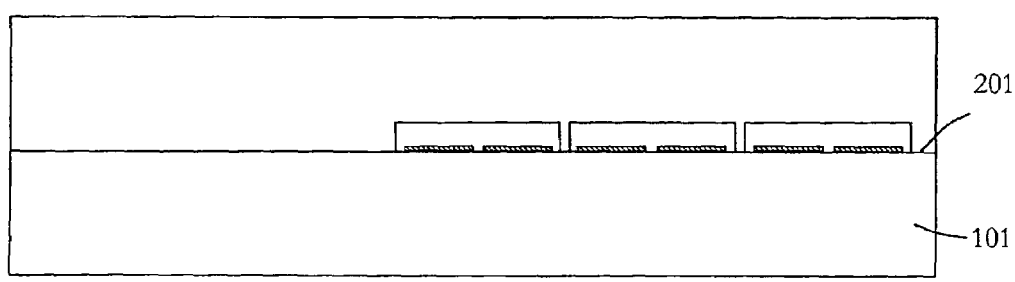

Referring to FIG. 2, the first substrate structure and the second substrate structure are bonded together via first face and second face. Bonding can occur using a variety of techniques. In a specific embodiment, the bonding occurs using covalent bonding processes. Each of the faces is cleaned and activated, e.g., plasma, wet processing. The activated surfaces are brought in contact with each other to cause a sticking action. Mechanical force is provided on each substrate structure to press the faces together. Using silicon based materials, silicon bearing bonds are created between the two faces. Preferably, bonding is facilitated using an oxide layer, such as silicon dioxide or other like material. Of course, one of ordinary skill in the art would recognize many other variations, modifications, and alternatives.

Figure 3:
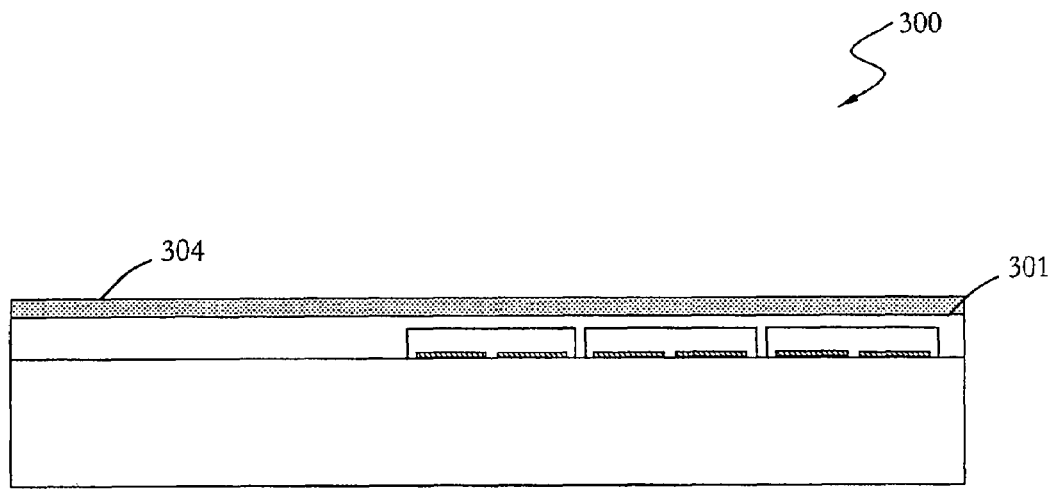

The method also includes applying a layer of photomasking material 304 overlying a backside surface of the first substrate, as shown in FIG. 3. The photomasking material is developed and film 301 is patterned. Preferably, the backside of the substrate is thinned before patterning. Thinning occurs using chemical mechanical planarization, grinding, etchback, any combination of these, and the like. Film 301 includes cavities and support members, which are disposed overlying electrodes, as shown.

Preferably, the method uses alignment marks to align a mask pattern onto the photomasking material. The method includes illuminating electromagnetic radiation through the layer of photoresist material and through a portion of the first thickness and detecting an indication of the alignment mark using a signal associated with a portion of the electromagnetic radiation. The method also includes exposing a portion of the layer of photomasking material once a pattern has been aligned using the alignment mark.

Figure 4:
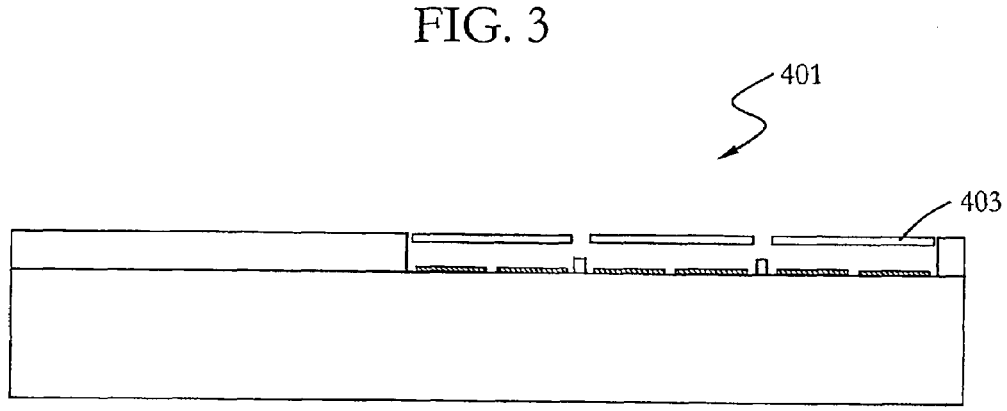
Figure 5:
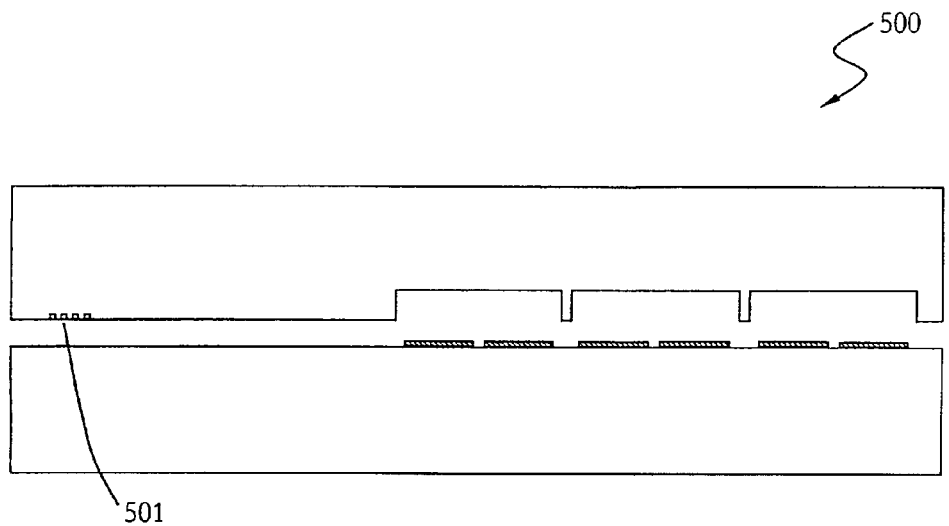
FIGS. 5 through 8 illustrate a method for fabricating and patterning a multilayered substrate structure according to an embodiment of the present invention.

Referring to FIG. 4, the method patterns film 301 to release mirror structures 403 overlying each of the cavities. The film is patterned using etching techniques. These etching techniques include wet and dry etching processes. Preferably, dry etching techniques are used. For example, such dry etching techniques using plasma processing with chlorine ($CF_4$) and fluorine ($SF_6$) bearing species. Dry etching is preferred for selectivity, etch profile, and other desirable features. Further details of specific alignment techniques can be found throughout the present specification and more particularly below.

FIGS. 5 through 8 illustrate a method for fabricating and patterning a multilayered substrate structure according to an embodiment of the present invention. These diagrams are merely examples, which should not unduly limit the scope of the claims herein. One of ordinary skill in the art would recognize many variations, alternatives, and modifications. As shown, the method is for fabricating mechanical structures from bonding substrates. The method includes providing a first substrate having a first thickness of silicon material and a first face and a second substrate having a second thickness and a second face. Preferably, the first substrate includes a plurality of deflection devices. The deflection devices can be mirror structures, such as movable mirrors. Such mirror structures can be used for display devices, such as DLP or the like. Each of the deflection structures can be formed on the first substrate, which is preferably a silicon on insulator substrate structure. The second substrate structure can be an integrated circuit device having a plurality of electrode devices, as shown. The integrated circuit device can include drive devices coupled to each of the electrodes. The drive devices can be used to apply voltages to the electrodes to actuate selected mirror devices on the first substrate structure. Preferably, the second substrate structure is made using a silicon wafer or other like substrate material. As noted, further details of such substrate structure can be found at U.S. patent application Ser. No. 10/718,482, filed Nov. 19, 2003, commonly owned, and hereby incorporated by reference for all purposes.

As shown, at least the first substrate or at least the second substrate (or both) has an alignment mark 501 comprising a front-side zero mark within a portion of either the first thickness or the second thickness. The alignment mark can be a plurality of patterns that are formed on the front-side zero mark region. Preferably, the patterns have been etched using patterning techniques. Etching has occurred before bonding.

Figure 6:
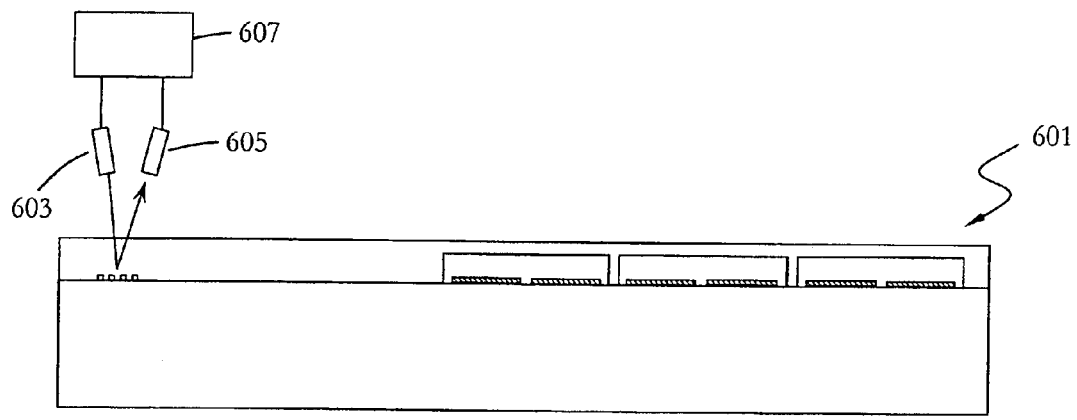

Referring to FIG. 6, the first substrate structure and the second substrate structure are bonded together via first face and second face. Bonding can occur using a variety of techniques. In a specific embodiment, the bonding occurs using covalent bonding processes. Each of the faces is cleaned and activated, e.g., plasma, wet processing. The activated surfaces are brought in contact with each other to cause a sticking action. Mechanical force is provided on each substrate structure to press the faces together. Using silicon based materials, silicon bearing bonds are created between the two faces. Preferably, bonding is facilitated using an oxide layer, such as silicon dioxide or other like material. As illustrated in FIG. 6, alignment mark 501 is buried by the bonding of the first substrate structure to the second substrate structure. Of course, one of ordinary skill in the art would recognize many other variations, modifications, and alternatives.

The method also includes applying a layer of photomasking material overlying a backside surface of the first substrate. The photomasking material is developed and film 601 is patterned. Preferably, the backside of the substrate is thinned before patterning. Thinning occurs using chemical mechanical planarization, grinding, etchback, any combination of these, and the like. Preferably, the thinned substrate is no greater than 0.5 microns for silicon bearing substrates. Film 601 includes cavities and support members, which are disposed overlying electrodes, as shown.

In a specific embodiment, the method includes illuminating electromagnetic radiation using a coherent light source 603 through the layer of photoresist material and through a portion of the first thickness. The light source is preferably a laser beam. The laser beam traverses through the photoresist and portion of the first thickness of material and scatters off of the alignment mark. The alignment mark is relatively shallow, e.g., 1200 Angstroms or less. Preferably, the alignment mark is a plurality of grooves in parallel to each other. The scattered light off of the alignment mark reflects back into a detector.

Figure 7:
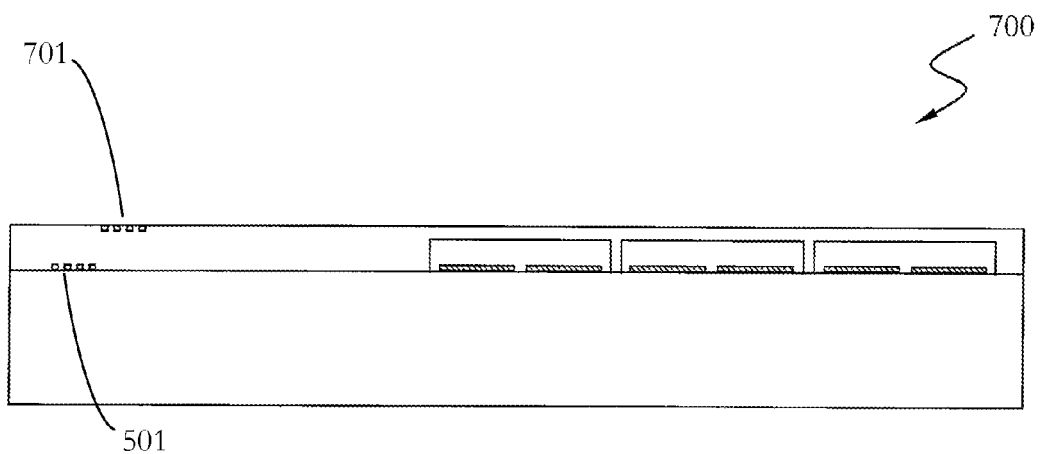
Figure 8:
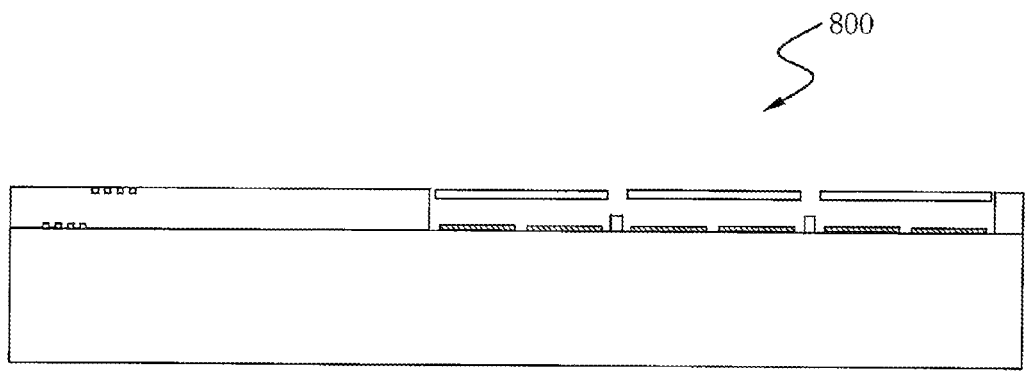

In a specific embodiment, the method includes detecting an indication of the alignment mark 501 using a signal associated with a portion of the electromagnetic radiation from a second backside of the second substrate. Detection occurs using a detector 605, which can be a CCD camera or the like. The detection technique occurs using an image processor 607 that looks for a predetermined pattern. The predetermined pattern is used to align the mask pattern onto the backside of the substrate such that the mirror is properly formed and released over the electrodes. The method also includes forming a second alignment mark (backside alignment mark 701 as illustrated in FIG. 7) on the backside surface of the first substrate by exposing a portion of the layer of photomasking material once a pattern a portion of a reticle structure has been aligned using the frontside alignment mark 501. Referring to FIG. 8, the method includes releasing each of the mirror structures, as shown.

Figure 9:
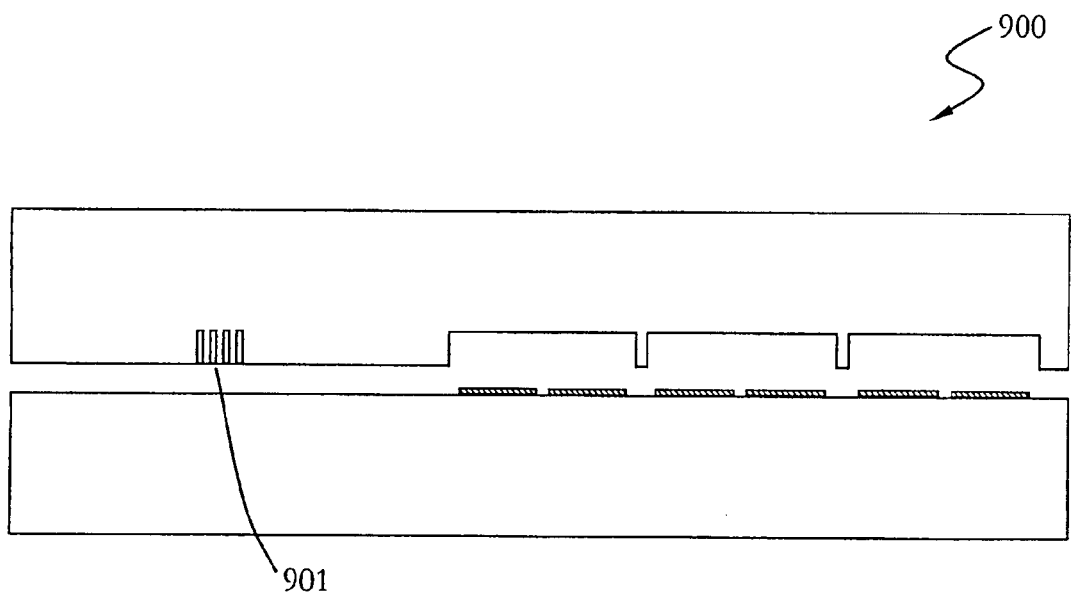
FIGS. 9 through 11 illustrate an alternative method for fabricating and patterning a multilayered substrate structure according to an alternative embodiment of the present invention.
Figure 10:
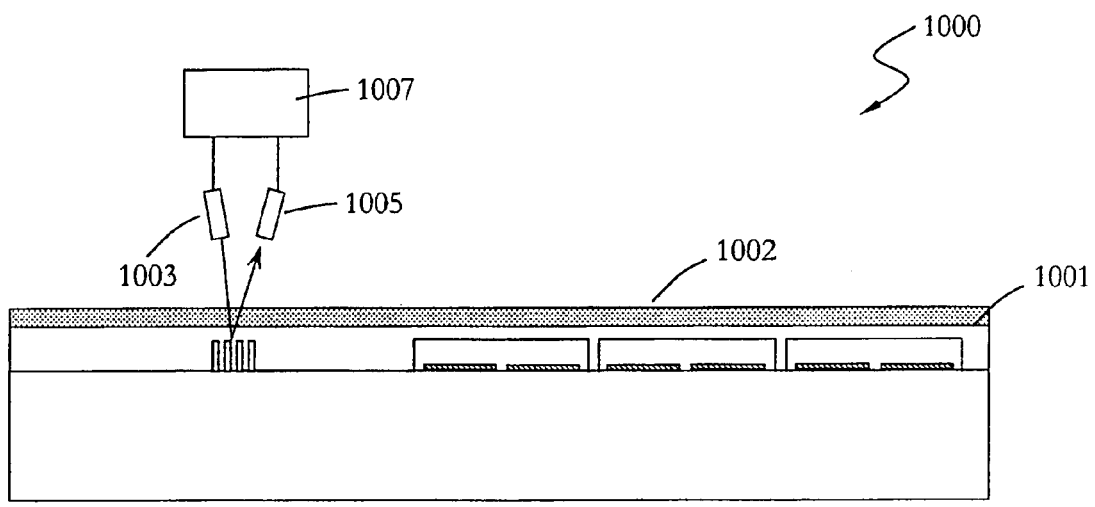
Figure 11:
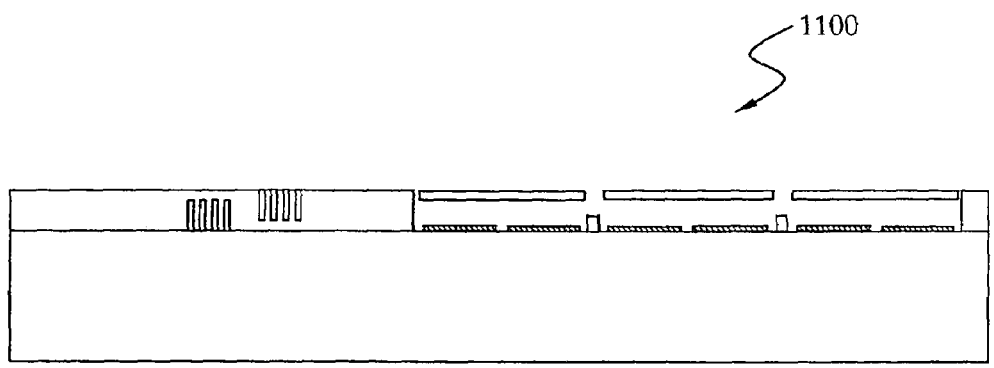

FIGS. 9 through 11 illustrate an alternative method for fabricating and patterning a multilayered substrate structure according to an alternative embodiment of the present invention. These diagrams are merely examples, which should not unduly limit the scope of the claims herein. One of ordinary skill in the art would recognize many variations, alternatives, and modifications. As shown, the method includes providing a first substrate having a first thickness of silicon material and a first face and a second substrate having a second thickness and a second face. Preferably, the first substrate includes a plurality of deflection devices. The deflection devices can be mirror structures, such as movable mirrors. Such mirror structures can be used for display devices, such as DLP or the like. Each of the deflection structures can be formed on the first substrate, which is preferably a silicon on insulator substrate structure. The second substrate structure can be an integrated circuit device having a plurality of electrode devices, as shown. The integrated circuit device can include drive devices coupled to each of the electrodes. The drive devices can be used to apply voltages to the electrodes to actuate selected mirror devices on the first substrate structure. Preferably, the second substrate structure is made using a silicon wafer or other like substrate material.

As shown, at least the first substrate or at least the second substrate (or both) has an alignment mark 901 comprising a front-side zero mark within a portion of either the first thickness or the second thickness. The alignment mark can be a plurality of patterns that are formed on the front-side zero mark region. Preferably, the patterns have been etched using patterning techniques. Etching has occurred before bonding.

Referring to FIG. 9, the first substrate structure and the second substrate structure are bonded together via first face and second face. Bonding can occur using a variety of techniques. In a specific embodiment, the bonding occurs using covalent bonding processes. Each of the faces is cleaned and activated, e.g., plasma, wet processing. The activated surfaces are brought in contact with each other to cause a sticking action. Mechanical force is provided on each substrate structure to press the faces together. Using silicon based materials, silicon bearing bonds are created between the two faces. Preferably, bonding is facilitated using an oxide layer, such as silicon dioxide or other like material. Of course, one of ordinary skill in the art would recognize many other variations, modifications, and alternatives.

The method also includes applying a layer of photomasking material 1002 overlying a backside surface of the first substrate. The photomasking material is developed and film 1001 is patterned. Preferably, the backside of the substrate is thinned before patterning. Thinning occurs using chemical mechanical planarization, grinding, etchback, any combination of these, and the like. Film 1001 includes cavities and support members, which are disposed overlying electrodes, as shown.

In a specific embodiment before patterning the film, the method includes illuminating electromagnetic radiation using a coherent light source through the layer of photoresist material and through a portion of the first thickness. Preferably, the method uses light source 1003, which can be a flood beam, which is not a laser beam. The method includes detecting an indication of the alignment mark using a signal associated with a portion of the electromagnetic radiation from a second backside of the second substrate using detector 1005. As shown, the alignment marks are much deeper than the prior embodiment since the light has less energy than the laser beam. Preferably, the alignment marks are a plurality of grooves, which include a depth of about two microns or so according to a specific embodiment. Less than 0.5 of a micron remains that the light traverses through. Similar to the previous embodiment, the method uses image processor 1007 to identify patterns to perform the alignment between a reticle and backside of the substrate.

The method also includes exposing a portion of the layer of photomasking material once a pattern a portion of the reticle structure has been aligned using the alignment mark. Once the mask has been patterned, the film is patterned using etching techniques, including dry etching. Referring to FIG. 11, the method includes releasing each of the mirror structures, as shown.

Depending upon the embodiment, the electromagnetic radiation can be derived from certain sources. The sources can include a laser source having a wave length about 300 nanometers to about 200 nanometers, and others. The source can also include visible light, infrared, and others. Additionally, the detection can occur using a variety of detection devices, e.g., charge coupled devices. Of course, one of ordinary skill in the art would recognize many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating mechanical deflection structures from bonding substrates, the method comprising:
   providing a bonded substrate structure, the bonded substrate structure comprising a first substrate having a first thickness and a first face, the bonded substrate structure comprising a second substrate having a second thickness and a second face, wherein the first face is bonded to the second face, at least the first substrate or at least the second substrate having a buried alignment mark on either the first face or the second face;
   applying a layer of photomasking material overlying a backside surface of the first substrate;
   illuminating electromagnetic radiation through the layer of photomasking material and through a portion of the first thickness, thereby scattering the electromagnetic radiation off of the buried alignment mark;
   detecting an indication of the buried alignment mark using a signal associated with a portion of the electromagnetic radiation, wherein the signal traverses through the portion of the first thickness and through the layer of photomasking material;
   aligning a pattern on a reticle to the layer of photomasking to an accuracy of 200 nanometers and less with respect to the buried alignment mark based on the detected indication; and
   exposing a portion of the layer of photomasking material once the pattern has been aligned using the buried alignment mark to form a second alignment mark on the backside surface of the first substrate.

2. The method of claim 1 wherein the portion of the first thickness is about two microns and less of silicon bearing material.

3. The method of claim 1 wherein the portion of the first thickness is no greater than 0.5 micron of silicon bearing material.

4. The method of claim 1 wherein the buried alignment mark comprises an etched structure.

5. The method of claim 1 wherein the electromagnetic radiation comprises IR.

6. The method of claim 1 wherein the electromagnetic radiation comprises visible light and the indication comprises a pattern.

7. The method of claim 1 wherein the indication is a standard ASML alignment mark.

8. The method of claim 1 wherein the first thickness has been thinned using a polishing process.

9. The method of claim 1 wherein the backside surface is a mirror surface.

10. The method of claim 1 wherein the detecting comprises capturing the signal using an array of charged coupled devices or other detection devices.

11. The method of claim 1 further comprising releasing one or more mirror structures from the exposed portion of the backside of the first substrate.

12. method of claim 1 wherein the buried alignment mark comprises a depth of about 1200 Angstroms.

13. The method of claim 1 wherein the illumination is a laser source having a wave length of about 300 nanometers to about 200 nanometers.

14. The method of claim 1 wherein the indication is a diffraction pattern.

15. A method for fabricating mechanical structures from bonding substrates, the method comprising:
   providing a bonded substrate structure, the bonded substrate structure comprising a first substrate having a first thickness of silicon material and a first face, the bonded substrate structure comprising a second substrate having a second thickness and a second face, at least the first substrate or at least the second substrate having a buried alignment mark comprising a front-side zero mark on either the first face or the second face;
   applying a layer of photomasking material overlying a first backside surface of the first substrate;
   illuminating electromagnetic radiation using a coherent light source through the layer of photomasking material and through a portion of the first thickness;
   detecting an indication of the buried alignment mark using a signal associated with a portion of the electromagnetic radiation from a second backside of the second substrate; and
   exposing a portion of the layer of photomasking material once a pattern of a reticle structure has been aligned using the detected indication of the buried alignment mark to form a second alignment mark on the first backside surface of the first substrate.

16. The method of claim 15 wherein the buried alignment mark comprises an etched structure.

17. The method of claim 15 wherein the electromagnetic radiation comprises IR.

18. The method of claim 15 wherein the electromagnetic radiation comprises visible light.

19. The method of claim 15 wherein the first thickness is no greater than 10 microns.

20. The method of claim 15 wherein the first thickness has been thinned using a polishing process.

21. The method of claim 15 wherein the backside surface is a mirror surface.

22. The method of claim 15 wherein the detecting comprises capturing the signal using an array of charged coupled devices or other detection devices.

23. The method of claim 15 further comprising releasing one or more mirror structures from the exposed portion of the backside of the first substrate.

24. The method of claim 15 wherein the buried alignment mark comprises a depth of about 1200 Angstroms.

25. The method of claim 15 wherein the illumination is a laser source having a wave length of about 300 nanometers to about 200 nanometers.

* * * * *